United States Patent [19]

Filliman

[11] Patent Number: 4,580,068

[45] Date of Patent: Apr. 1, 1986

[54] KEYED LOW IMPEDANCE VOLTAGE SOURCE

[75] Inventor: Paul D. Filliman, Indianapolis, Ind.

[73] Assignee: RCA Corporation, Princeton, N.J.

[21] Appl. No.: 561,334

[22] Filed: Dec. 14, 1983

[51] Int. Cl.[4] .............................................. H03K 5/08
[52] U.S. Cl. ............................... 307/296 A; 307/549; 307/243; 358/21 R
[58] Field of Search ................... 307/296 A, 549, 243; 358/20, 21, 172, 178

[56] References Cited

U.S. PATENT DOCUMENTS

| | | | |
|---|---|---|---|
| 4,135,200 | 1/1979 | Shancey, II | 358/21 R |
| 4,143,398 | 3/1979 | Harwood et al. | 358/172 |
| 4,506,176 | 3/1985 | Harris | 307/549 |

OTHER PUBLICATIONS

"Non-Binary Logic Circuits"—C. W. Ross, Wireless World, Dec. 1982, pp. 68–70.

Primary Examiner—John S. Heyman
Attorney, Agent, or Firm—Eugene M. Whitacre; Paul J. Rasmussen; William H. Meagher

[57] ABSTRACT

First and second transistors of the same conductivity type have their emitter-collector paths serially disposed across a DC operating potential source, with the emitter electrode of the first transistor directly connected to the collector electrode of the second transistor and to an output terminal. First and second emitter-followers have inputs commonly connected via a resistor to a reference point. The output of the first emitter-follower directly drives the base electrode of the first transistor, while the base electrode of the second transistor is rendered responsive to the output of the second emitter-follower. A control transistor is commonly connected to the inputs of the emitter-followers so as to disable said emitter-followers and render both of said first and second transitors non-conductive when said control transistor is conducting, and to enable said emitter-followers and render both of said first and second transistors conducting when control transistor is cut off. A keying circuit is coupled to said control transistor for cutting off the control transistor only during predetermined keying periods. The selective cutoff of the control transistor effectively clamps the output terminal during each keying period to an output voltage level which is independent of the magnitude of said operating potential and determined in accordance with the potential at said reference point.

6 Claims, 1 Drawing Figure

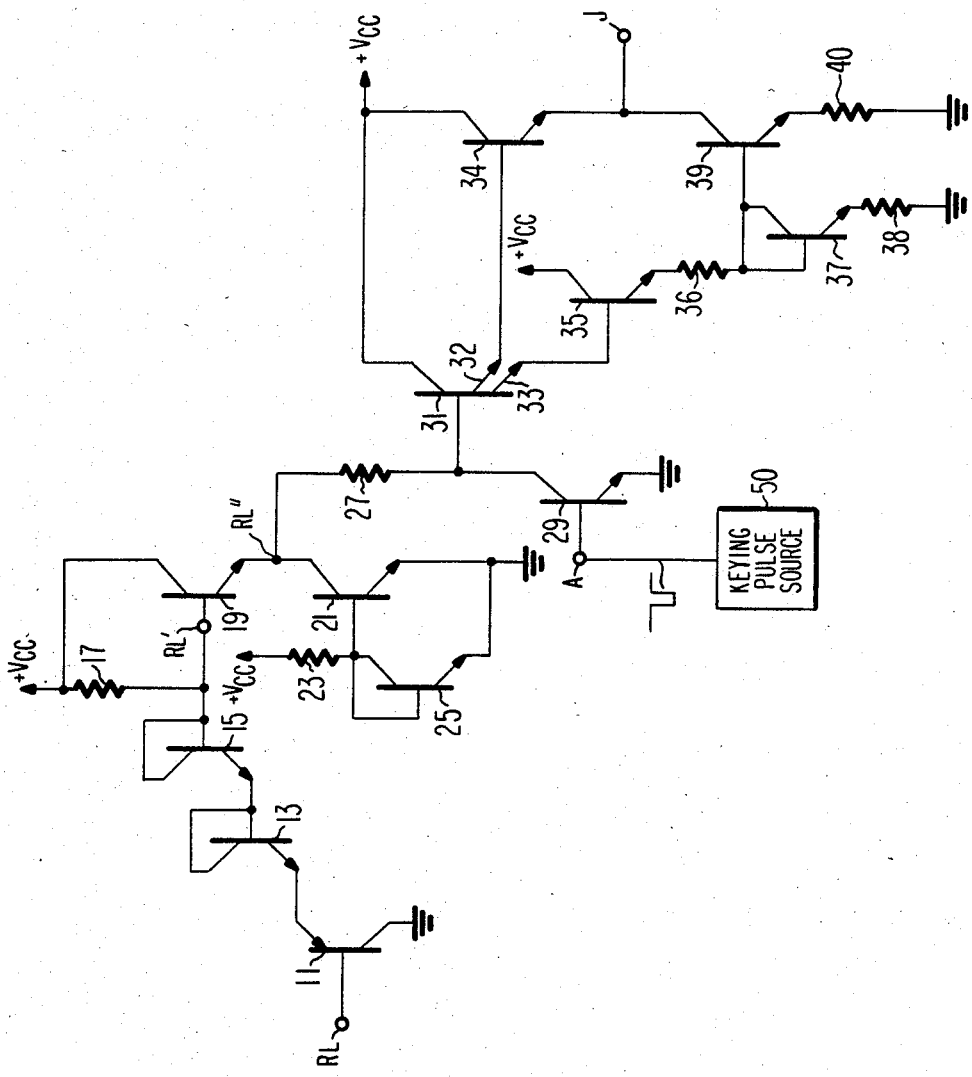

KEYED LOW IMPEDANCE VOLTAGE SOURCE

The present invention relates generally to keyed circuits and particularly to a circuit functioning as a low impedance source of voltage when keyed and appearing as a high impedance open circuit in the absence of keying.

A particular example of utility for a keyed circuit of the above-described characteristics arises in a trilevel sandcastle pulse encoder of the type disclosed in the copending U.S. patent application, Ser. No. 561,333, of J. Hettiger, entitled "Trilevel Sandcastle Pulse Encoder" and now U.S. Pat. No. 4,558,355.

Where a multiplicity of keying functions with different timing requirements are subject to performance within a common integrated circuit, a savings in terminal count may be realized by externally forming a composite, multilevel keying waveform for delivery to a single input terminal of the integrated circuit, and including within the integrated circuit level-sensitive decoder circuits for extracting respective keying waves of different timing from the delivered composite waveform (which is viewable as having a sandcastle-like profile).

An example of encoder circuitry suitable for use in the formation of a sandcastle pulse train with pulse components of two different levels (above a base level) is shown in U.S. Pat. No. 4,313,130—Yost. An example of decoder circuitry suitable for use in separating the pulse components of bilevel sandcastle pulses of the type generated by the Yost encoder is presented in an article entitled "Integrated NTSC Chrominance/Luminance Processor", by L. Harwood, et al., appearing on pages 693-706 the IEEE Transactions on Consumer Electronics, Volume CE-26 (November 1980).

In the example of the above-discussed Harwood, et al. decoder, a retrace blanking waveform and a burst gating waveform, for use in luminance/chrominance signal processing circuits of a color television receiver, are separately derived from bilevel sandcastle pulses. The bilevel sandcastle pulses exhibit a first level during initial and concluding portions of the recurring periods when retrace blanking is desired, but exhibit a second higher level during intermediate ("backporch") portions of the recurring periods, which intermediate portions coincide in timing with recurring intervals during which the burst gating function is to be performed. In this instance of sandcastle pulse use, there is an overlap of the keying functions to be performed with retrace blanking continuing through each burst gating period. In the instance of a color television receiver of the type incorporating apparatus for automatic control of color kinescope biasing, a set of keying functions, inclusive of non-overlapping as well as overlapping functions, is desirably associated with the receiver's luminance/chrominance signal processing circuits, as explained in the copending U.S. patent application, Ser. No. 561,176, of R. Shanley, now U.S. Pat. No. 4,554,588 and entitled "Control System For Luminance/Chrominance Signal Processing Circuits."

An illustrative arrangement for automatic control of color kinescope biasing in a color television receiver is that described in U.S. Pat. No. 4,263,622—Hinn. In the Hinn arrangement, a control period, occupying a period of several successive line intervals within each vertical blanking interval, is set aside for monitoring a black level current produced by an electron gun under reference signal conditions, for detection of departures from a desired current level, and for readjustment of gun bias to oppose the undesired departures. During a portion of the control period, the color kinescope grid receives a conduction-enhancing pulse; bias control is based upon information derived as indicative of the change in cathode current level introduced by the grid pulsing. An advantageous system for utilization of the above-described Hinn approach in maintenance of an appropriate bias relationship among the color kinescope's gun trio (in the face of aging and other parameter variations) is described in the copending U.S. patent application Ser. No. 434,314 of R. P. Parker, now U.S. Pat. No. 4,484,228.

For successful use of automatic kinescope bias (AKB) control in the manner exemplified by the structures of the aforementioned Hinn patent and Parker patent application, it is recognized in the aforementioned Shanley application that the luminance/chrominance signal processing circuits, which process signal information for delivery to the color kinescope during the time periods intervening the periodically recurring kinescope bias control intervals, require some suitable form of manipulation during the kinescope bias control intervals to avoid undesirable disturbance or contamination of the current monitoring and bias adjustment functions.

To convey to a single chip input terminal timing information identifying the recurring kinescope bias control intervals, in addition to the timing information conveyed by the bilevel sandcastle pulses discussed above, it is proposed in the aforementioned copending Hettiger patent application to employ encoder apparatus for forming sandcastle pulses of a trilevel form, i.e., with three different levels (above a base level) for the respective pulse components.

In the Hettiger encoder, indication of the kinescope bias control interval's timing is associated with an intermediate voltage level falling between low and high voltage levels associated with the additional, overlapping pulse components of the sandcastle pulse train. To simplify design requirements for decoder apparatus effecting recovery of control interval timing information from the trilevel sandcastle pulses, the Hettiger encoder apparatus is arranged so as to preclude sandcastle pulse excursions away from the intermediate voltage level during the recurring control intervals.

A trilevel sandcastle pulse encoder, in accordance with an illustrative embodiment of the Hettiger patent application, includes: a source of a first train of monolevel pulses comprising line and field rate pulses with timing appropriate for retrace blanking purposes; a source of a second train of monolevel pulses comprising line rate pulses with "backporch" timing appropriate for burst gating purposes, with each of the pulses of the second train overlapping in time a portion of a pulse of said first train; and a source of a third train of monolevel pulses comprising field rate pulses coinciding with the kinescope bias control intervals.

In the Hettiger encoder arrangement, the first and second trains of pulses are used to develop at a first terminal a train of bilevel pulses exhibiting a first voltage level during periods of overlapping of the pulses of the first and second trains, and exhibiting a second, lesser voltage level during the remaining, non-overlapping portions of the pulses of the first train. A resistor interconnects the first terminal with a second terminal. Keyed means, coupled to the source of the third train of pulses, are provided for developing a voltage of a third level, intermediate the first and second voltage levels, at the second terminal during the recurring control intervals. The keyed voltage developing means exhibits, during the control intervals, an output impedance significantly lower than the impedance exhibited by the interconnecting resistor; however, during the periods intervening successive ones of the control intervals, the voltage developing means is effectively disabled and exhibts an output impedance significantly higher than the impedance exhibited by the resistor. Due to the impedance relationship exhibited during the control intervals, the potential at the second terminal is held at the intermediate voltage level, independent of excursions of the bilevel pulses at the first terminal during the control intervals. In contrast, due to the differing impedance relationship exhibited during the intervening periods, the potential at the second terminal is free to follow signal excursions at the first terminal during the intervening periods.

A keyed voltage source constructed in accordance with the principles of the present invention may be advantageously employed to implement the function of the keyed voltage developing means in the above-described trilevel sandcastle pulse decoder.

In accordance with an illustrative embodiment of the present invention, the keyed voltage source employs first and second transistors of the same conductivity type disposed with their emitter-collector paths in series across a DC operating potential source, with the emitter electrode of the first transistor directly connected to the collector electrode of the second transistor and to an output terminal. The keyed voltage source also includes first and second emitter-followers having inputs commonly connected via a resistor to a reference point exhibiting a potential of a magnitude desirably independent of the magnitude of the DC potential provided by the aforesaid operating potential source. DC conductive means are provided for connecting the output of the first emitter-follower to the base electrode of the first transistor, while the base electrode of the second transistor is rendered responsive to the output of the second emitter-follower. Control means, including a control transistor commonly connected to the inputs of said emitter-followers, are provided for disabling said emitter-followers and rendering both of said first and second transistors non-conductive when said control transistor is rendered conducting, and for enabling said emitter-followers and rendering both of said first and second transistors conducting when said control transistor is cut off. Additionally, keying means are coupled to said control transistor for cutting off said control transistor only during predetermined keying periods.

In operation of the above-described embodiment, the selective cutoff of the control transistor effectively clamps the output terminal during each keying period to an output voltage level which is independent of the magnitude of the DC potential provided by said operating potential source, and which is determined in primary accordance with the potential at said reference point and offset therefrom by a 2 $V_{be}$ potential.

Illustratively, a sandcastle pulse encoder of the above-described Hettiger type is desirably employed in trilevel sandcastle pulse encoding/decoding system enjoying the tracking features of the system disclosed in another copending U.S. patent application, Ser. No. 561,330, of J. Hettiger, entitled "Trilevel Sandcastle Pulse Encoding/Decoding System" and now U.S. Pat. No. 4,549,202. In such a system incorporating a common voltage divider across a DC supply for deriving a set of three reference voltages for voltage comparators of the system's decoder, it is particularly desired that the middle pulse level of the trilevel sandcastle pulse train formed by the encoder correspond to a fourth reference voltage comprising the output of an additional voltage divider connected across the same DC supply as the first voltage divider. In use of an embodiment of the keyed voltage source of the present invention in an encoder for such an encoding/decoding system, the keyed voltage source may advantageously also include a reference voltage input terminal, and means, including a plurality of forward-biased semiconductor junctions serially disposed between said input terminal and the previously mentioned reference point, for establishing the voltage at the reference point at a level offset from the voltage at said input terminal in a second direction (opposite to said first direction) by a 2 $V_{be}$ potential. With such a facility provided, application of the fourth reference voltage to said input terminal of the keyed voltage source ensures that the output voltage level to which said output terminal is clamped during said keying periods corresponds to said fourth reference voltage.

In the accompanying drawing, the sole FIGURE depicts, partially schematically and partially by block representation, a keyed voltage source embodying the principles of the present invention.

In the illustrated arrangement, a reference voltage input terminal RL is directly connected to the base electrode of a PNP transistor 11, disposed with its collector electrode grounded. The emitter electrode of transistor 11 is directly connected to the emitter electrode of a first diode-connected NPN transistor 13. The joined base and collector electrodes of transistor 13 are directly connected to the emitter electrode of a second diode-connected transistor 15. The joined base and collector electrodes of transistor 15 are connected via a resistor 17 to the positive terminal (+$V_{cc}$) of an operating potential supply (having a grounded negative terminal).

Current supplied via resistor 17 forward biases the base-emitter junctions of transistors 11, 13 and 15, resulting in development of a potential at terminal RL' (at the junction of resistor 17 and transistor 15) which is offset in the positive direction from the reference voltage at terminal RL by a voltage (3$V_{be}$) equal to three times the magnitude of the offset potential ($V_{be}$) exhibited by a forward biased base-emitter junction.

Terminal RL' is directly connected to the base electrode of an NPN transistor 19 disposed as an emitter-follower, with its collector electrode directly connected to the +$V_{cc}$ supply terminal. An NPN transistor 21, disposed with its collector electrode directly connected to the emitter electrode of transistor 19 and with its emitter electrode grounded, serves as a current source for the emitter-follower transistor 19. The current drawn by the current source transistor 21 is determined by a biasing circuit comprising a resistor 23 connected between the +$V_{cc}$ supply terminal and the base electrode of transistor 21, and a diode-connected NPN transistor 25 shunting the base-emitter path of transistor 21. The diode-connected transistor 25 is disposed with its joined base and collector electrodes directly connected to the base electrode of transistor 21, and with its emitter electrode grounded. A reference point RL" (at the emitter electrode of transistor 19) exhibits a potential which is offset in the positive direction from the reference voltage at terminal RL by a $2V_{be}$ potential, and which is independent of the potential at the $+V_{cc}$ supply terminal.

A resistor 27 links the reference point RL" to the base electrode of a multiple-emitter NPN transistor 31, disposed with its collector electrode directly connected to the $+V_{cc}$ supply terminal. An NPN control transistor 29 is disposed with its collector electrode directly connected to the base electrode of the multiple-emitter transistor 31, with its emitter electrode grounded, and with its base electrode connected to a keying wave input terminal A. A keying pulse source 50 supplies a negative-going keying pulse to terminal A during predetermined keying periods.

A first emitter electrode (32) of transistor 31 is directly connected to the base electrode of a first NPN output transistor 34. Output transistor 34 is arranged with its emitter electrode directly connected to an output terminal J, and with its collector electrode directly connected to the $+V_{cc}$ supply terminal.

A second emitter electrode (33) of transistor 31 is directly connected to the base electrode of an NPN emitter-follower transistor 35, disposed with its collector electrode directly connected to the $+V_{cc}$ supply terminal. A resistor 36 links the emitter electrode of emitter-follower transistor 35 to the base electrode of a second NPN output transistor 39, disposed with its collector electrode directly connected to output terminal J. A resistor 40 returns the emitter electrode of output transistor 39 to ground. A diode-connected NPN transistor 37 is arranged with its joined base and collector electrodes directly connected to the base electrode of output transistor 39, and with its emitter electrode returned to ground via a resistor 38.

In operation of the illustrated arrangement, when a negative-going keying pulse appears at the keying wave input terminal A, control transistor 29 is cut off. Under these circumstances, the potential at the base electrode of transistor 31 is elevated sufficiently to enable transistors 31, 34, 35, 37 and 39 to simultaneously conduct. With output transistors 34 and 39 conducting, the keyed voltage source presents a very low impedance to output terminal J, and establishes a potential thereat which is offset in a negative direction from the potential at reference point RL" by a $2V_{be}$ amount (neglecting as insignificant the slight voltage drop developed across resistor 27 by the base current of the conducting transistor 31). With the negative offsets introduced by the voltage drops across the forward-biased base-emitter junctions of transistors 19, 31 and 34 effectively canceling the effects of the positive offsets introduced by the voltage drops across the forward-biased base-emitter junctions of transistors 11, 13, and 15, the output potential at terminal J during each keying interval is directly determined by (and substantially equal to) the reference voltage at the reference level input terminal RL, and is effectively independent of the supply potential at the operating potential supply terminal $+V_{cc}$, and any variations to which such supply potential may be subject.

Outside the predetermined keying periods, the keying wave base level at terminal A renders control transistor 29 conducting to depress the potential at the base electrode of transistor 31 sufficiently so as to disable transistors 31, 34, 35, 37 and 39. With output transistors 34 and 39 simultaneously cut off under these circumstances, the voltage source output is effectively open-circuited and output terminal J is freed for control by circuitry external to the voltage source.

What is claimed is:

1. A keyed voltage source comprising, in combination:

a source of DC operating potential;

first and second transistors, of a first conductivity type, each having base, emitter and collector electrodes; the emitter-collector paths of said first and second transistors being disposed in series across said DC potential source, with the emitter electrode of said first transistor directly connected to the collector electrode of said second transistor and to an output terminal;

a reference point exhibiting a potential of a magnitude independent of the magnitude of the DC potential provided by said operating potential source;

first and second emitter-followers having inputs commonly connected via a resistor to said reference point;

DC conductive means for connecting the output of said first emitter-follower to the base electrode of said first transistor;

means for rendering the base electrode of said second transistor responsive to the output of said second emitter-follower;

a control means including a control transistor, commonly connected to the inputs of said emitter-followers, for disabling said emitter-followers and rendering both of said first and second transistors non-conductive when said control transistor is rendered conducting, and for enabling said emitter-followers and rendering both of said first and second transistors conducting when said control transistor is cut off; and keying means, coupled to said control transistor, for cutting off said control transistor only during predetermined keying periods, the cutoff of said control transistor enabling said emitter-followers and rendering said transistors conducting during said keying periods so as to effectively clamp said output terminal to an output voltage level which is independent of the magnitude of said DC potential provided by said operating potential source, which output voltage level is determined in accordance with the potential at said reference point and is offset therefrom in a first direction by a $2V_{be}$ potential.

2. A keyed voltage source comprising, in combination:

a source of DC operating potential;

first and second transistors, of a first conductivity type, each having base, emitter and collector electrodes; the emitter-collector paths of said first and second transistors being disposed in series across said DC potential source, with the emitter electrode of said first transistor directly connected to the collector electrode of said second transistor and to an output terminal;

a reference point exhibiting a potential of a magnitude independent of the magnitude of the DC potential provided by said potential source;

first and second emitter-followers having inputs commonly connected via a resistor to said reference point;

DC conductive means for connecting the output of said first emitter-follower to the base electrode of said first transistor;

means for rendering the base electrode of said second transistor responsive to the output of said second emitter-follower;

a control means including a control transistor, commonly connected to the inputs of said emitter-followers, for disabling said emitter-followers and rendering both of said first and second transistors non-conductive when said control transistor is rendered conducting, and for enabling said emitter-followers and rendering both of said first and second transistors is cut off; and keying means, coupled to said control transistor, for cutting off said control transistor only during predetermined keying periods, the cutoff of said control transistor enabling said emitter-followers and rendering said transistors conducting during said keying periods so as to effectively clamp said output terminal to an output voltage level which is independent of the magnitude of said DC potential provided by said operating potential source, which output voltage level is determined in accordance with the potential at said reference point and is offset therefrom in a first direction by a $2V_{be}$ potential;

said apparatus also including:

an input terminal for receiving a reference voltage; and means, including a plurality of forward-biased semiconductor junctions serially disposed between said input terminal and said reference point, for establishing the voltage at said reference point at a level offset from the voltage at said input terminal by a $2V_{be}$ potential in a second direction opposite to said first direction;

whereby the output voltage level to which said output terminal is clamped during said keying periods corresponds to said reference voltage at said input terminal.

3. Apparatus in accordance with claim 2, wherein said means for rendering the base electrode of said second transistor responsive to the output of said second emitter-follower comprises:

a fourth, diode-connected, transistor, of said first conductivity type, coupled with said second transistor to form a current mirror therewith;

a second resistor for supplying an input current to said current mirror;

a fifth transistor, of said first conductivity type, disposed in an emitter-follower configuration, and having a base electrode responsive to the output of said second emitter-follower, and an emitter electrode disposed to supply said input current to said current mirror via said second resistor.

4. Apparatus in accordance with claim 3 including:

a sixth transistor, of a second conductivity type, opposite to said first conductivity type, disposed in an emitter-follower configuration, and having a base electrode directly connected to said input terminal;

seventh and eighth transistors, of said first conductivity type, having serially disposed base-emitter paths;

a third resistor;

means for shunting the series combination of said third resistor, said serially disposed base-emitter paths, and the emitter-collector path of said sixth transistor across said DC potential source;

a ninth transistor, of said first conductivity type, disposed in an emitter-follower configuration, having a base electrode directly connected to the junction of said resistor with said serially disposed base-emitter paths, and having an emitter electrode directly connected to said reference point;

the base-emitter junctions of said sixth, seventh, eighth and ninth transistors serving as said plurality of serially disposed semiconductor junctions.

5. Apparatus in accordance with claim 4 wherein a tenth transistor, of said first conductivity type, and having base and collector electrodes and a pair of emitter electrodes, serves as the active device of said first and second emitter-followers.

6. Apparatus in accordance with claim 5 wherein said first conductivity type is NPN, and wherein said control transistor comprises an NPN transistor having a collector electrode directly connected to the base electrode of said tenth transistor, an emitter electrode connected to a negative terminal of said operating potential source, and a base electrode coupled to receive the output of said keying means.

* * * * *